(12) United States Patent
Reitsma

(10) Patent No.: US 9,797,748 B2
(45) Date of Patent: Oct. 24, 2017

(54) GEAR SENSING BASED ON DIFFERENTIAL/ASYMMETRIC INDUCTIVE SENSING

(71) Applicant: Texas Instruments Incorporated, Dallas, TX (US)

(72) Inventor: George P. Reitsma, Redwood City, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 48 days.

(21) Appl. No.: 14/577,733

(22) Filed: Dec. 19, 2014

(65) Prior Publication Data

US 2015/0362337 A1    Dec. 17, 2015

Related U.S. Application Data

(60) Provisional application No. 61/921,936, filed on Dec. 30, 2013.

(51) Int. Cl.
| | |
|---|---|
| *G01D 5/20* | (2006.01) |
| *G01M 13/02* | (2006.01) |
| *G01R 33/02* | (2006.01) |
| *G01P 3/488* | (2006.01) |

(52) U.S. Cl.
CPC ............ *G01D 5/20* (2013.01); *G01D 5/2006* (2013.01); *G01M 13/021* (2013.01); *G01P 3/488* (2013.01); *G01R 33/02* (2013.01)

(58) Field of Classification Search
CPC ....... G01D 5/20; G01D 5/2006; G01M 13/02; G01M 13/021; G01R 33/02; G01P 3/488
See application file for complete search history.

(56) References Cited

U.S. PATENT DOCUMENTS

| | | | | |
|---|---|---|---|---|
| 5,596,189 A | * | 1/1997 | Orton .................. | G01D 5/2451 |
| | | | | 250/231.16 |
| 2010/0181993 A1 | | 7/2010 | Fernandez et al. | |
| 2012/0249126 A1 | * | 10/2012 | Friedrich ............. | G01D 5/2448 |
| | | | | 324/207.13 |

FOREIGN PATENT DOCUMENTS

| | | |
|---|---|---|
| RU | 2082088 | 6/1997 |
| WO | WO 2010040429 | 4/2010 |
| WO | WO 2012134644 | 4/2012 |

* cited by examiner

*Primary Examiner* — Patrick Assouad
*Assistant Examiner* — Haidong Zhang
(74) *Attorney, Agent, or Firm* — Andrew Viger; Charles A. Brill; Frank D. Cimino

(57) ABSTRACT

An inductive gear sensing system suitable for sensing gear (gear tooth) movement, such as some combination of speed, direction and position, based on differential sensor response waveforms. Example embodiments of inductive gear sensing with differential sensor response for different gear configurations include generating differential pulsed/phased sensor response signals from dual differential sensors based on axial (proximity-type) sensing for offset differential sensors (FIG. 1B, 102, 102; FIG. 2B, 201, 202), and generating asymmetrical response signals from a single sensor based on lateral and axial sensing with either asymmetrical gear teeth (FIG. 3A, 30A; FIG. 3B, 30B) or an asymmetrical sensor (FIG. 4B, 401) or a combination of both.

15 Claims, 7 Drawing Sheets

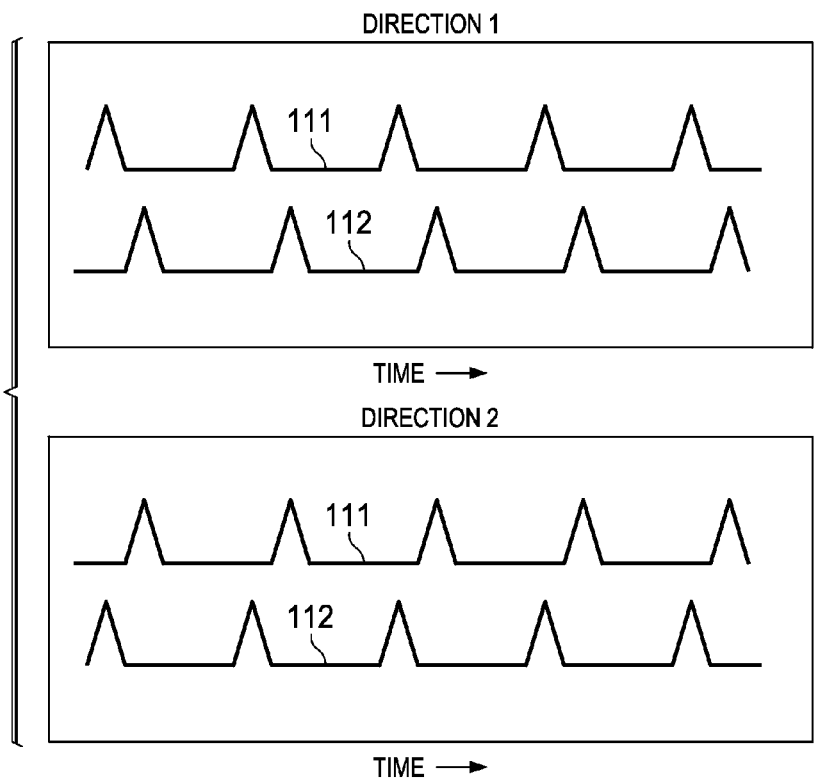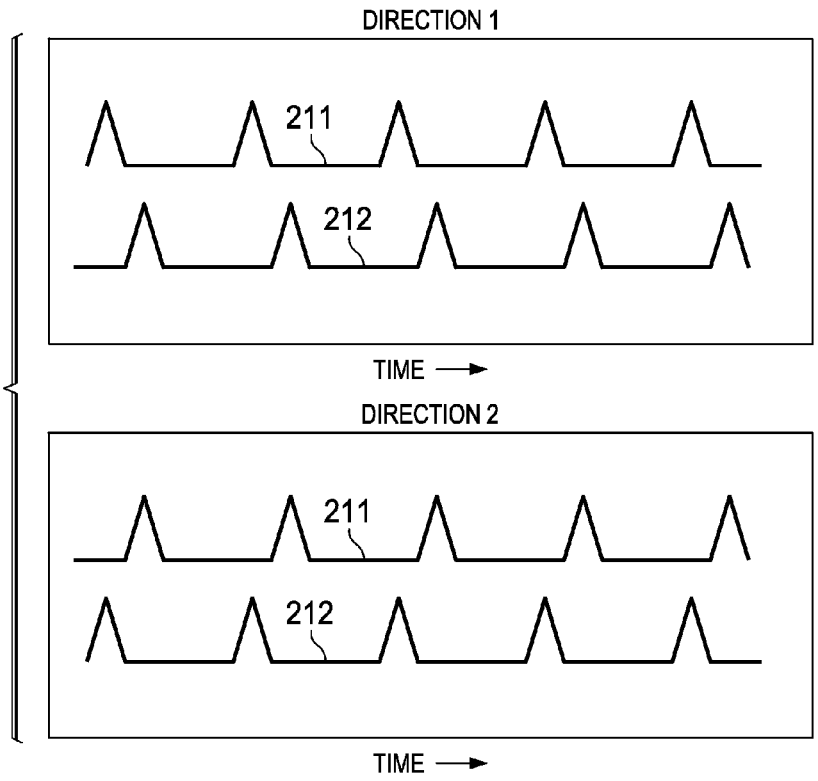

DIRECTION 2  DIRECTION 1

GEAR SENSING BASED ON DIFFERENTIAL/ASYMMETRIC INDUCTIVE SENSING

CROSS-REFERENCE TO RELATED APPLICATIONS

Priority is claimed under USC§119(e) to U.S. Provisional Application 61/921,936, filed 30 Dec. 2013.

BACKGROUND

Technical Field

This Patent Disclosure relates generally to gear sensing such as gear speed and gear tooth counting.

Related Art

Gear sensors are used to sense gear movement, such as speed, position and gear tooth counting. Mechanical systems can be used, but to avoid the attendant issues of wear and failure, electro-magnetic systems have been used to convert the repetitive passing of gear teeth past a sensor into electrical data (such as sensor pulse response).

One common approach is Hall effect gear tooth sensing, which uses a Hall element to sense the variation in flux in the airgap between a magnet and passing ferrous metallic gear teeth. The output of the Hall element can be converted to digital data, and processed to create a digital output that represents gear speed and/or position.

BRIEF SUMMARY

This Brief Summary is provided as a general introduction to the Disclosure provided by the Detailed Description and Figures, summarizing some aspects and features of the disclosed invention. It is not a complete overview of the Disclosure, and should not be interpreted as identifying key elements or features of the invention, or otherwise characterizing or delimiting the scope of the invention disclosed in this Patent Document.

The Disclosure is directed to the problem of sensing gear (gear tooth) movement, such as some combination of speed, direction and position. The Disclosure describes apparatus and methods for gear sensing based on differential/asymmetrical (differential or asymmetrical) inductive sensing.

According to aspects of the Disclosure, an inductive sensing system suitable to sensing movement of a conductive gear includes a conductive gear with gear teeth, and first and second inductive sensors disposed adjacent the gear, such that gear movement causes the gear teeth to move past the inductive sensors. Each sensor is configured to define a sensing area corresponding in size to the gear teeth, such that gear tooth movement past the sensor results in an axially-sensed sensor response pulse. The sensors are arranged, such that a gear tooth moves through the sensing area of the first sensor with a time differential relative to moving through the sensing area of the second sensor, so that the sensors provide respective differential sensor response pulses with a phase difference corresponding to the direction of movement of the gear teeth relative to the sensors.

In described examples, (a) the gear teeth are orthogonal to the direction of movement, and the sensors are offset relative to the direction of movement, and (b) the gear teeth are at an angle to the direction of movement, and the sensors are in-line and orthogonal to the direction of movement.

According to other aspects of the Disclosure, an inductive sensing system suitable to sensing movement of a conductive gear includes a conductive gear with gear teeth that are asymmetrical, and a sensor disposed adjacent the gear, and configured to define a sensing area corresponding in size to the asymmetrical gear teeth. Gear tooth movement past the sensor results in an asymmetrical sensor response due to a change the area of the conductive gear tooth that is within the sensing area, so that the sensor provides an asymmetrical sensor response corresponding to the direction of movement of the asymmetrical gear teeth relative to the sensor.

According to other aspects of the Disclosure, an inductive sensing system suitable to sensing movement of a conductive gear includes a conductive gear with gear teeth, and an asymmetrical sensor configured with an asymmetric profile in which sensitivity changes from a lower sensitivity at a lower sensitivity end to a higher sensitivity at a higher sensitivity end. The asymmetrical sensor is disposed adjacent the gear with an incline orientation relative to the gear teeth, such that a gear tooth moves past the lower sensitivity end with a time differential relative to moving past the higher sensitivity end, and as a result, the asymmetrical sensor provides an asymmetrical sensor response corresponding to the direction of movement of the gear teeth relative to the asymmetrical sensor.

Other aspects and features of the invention claimed in this Patent Document will be apparent to those skilled in the art from the following Disclosure.

BRIEF DESCRIPTION OF THE DRAWINGS

FIGS. 1A, 1B, 1C illustrate an example functional embodiment of inductive gear sensing, including gear direction, for a spur gear target (1A/1B, 10), with differential sensors (101, 102) offset relative to the gear shaft, such that (1C) differential sensor response indicates gear direction.

FIGS. 2A, 2B, 2C illustrate an example functional embodiment of inductive gear sensing, including gear direction, for a helical gear target (2A/2B), with in-line differential sensors (201, 202) aligned with the gear shaft, such that (2C) differential sensor response indicates gear direction.

DESCRIPTION

This Description and the Figures constitute a Disclosure of example embodiments and applications that illustrate various features and advantages of gear sensing based on differential/asymmetrical (differential or asymmetrical) inductive sensing. As used in this Disclosure, an asymmetrical sensor response is characterized by different rise and fall times.

In brief overview, an inductive sensing system is suitable for sensing gear (gear tooth) movement, such as some combination of speed, direction and position, based on differential or asymmetrical sensor response waveforms. Example embodiments of inductive sensing with differential/asymmetrical sensor response for different gear configurations include: (FIGS. 1 and 2) generating differential pulsed/phased sensor response from dual differential sensors based on axial (proximity-type) sensing, and (FIGS. 3 and 4) generating asymmetrical response from a single sensor based on lateral and axial sensing with either asymmetrical gear teeth or an asymmetrical sensor or a combination of both.

The example embodiments in the Figures illustrate rotational gear configurations in which gear teeth move rotationally past the sensor(s). The Disclosure has applicability as well to strip gears in which the gear teeth move laterally past the sensor(s).

Figure 1A:
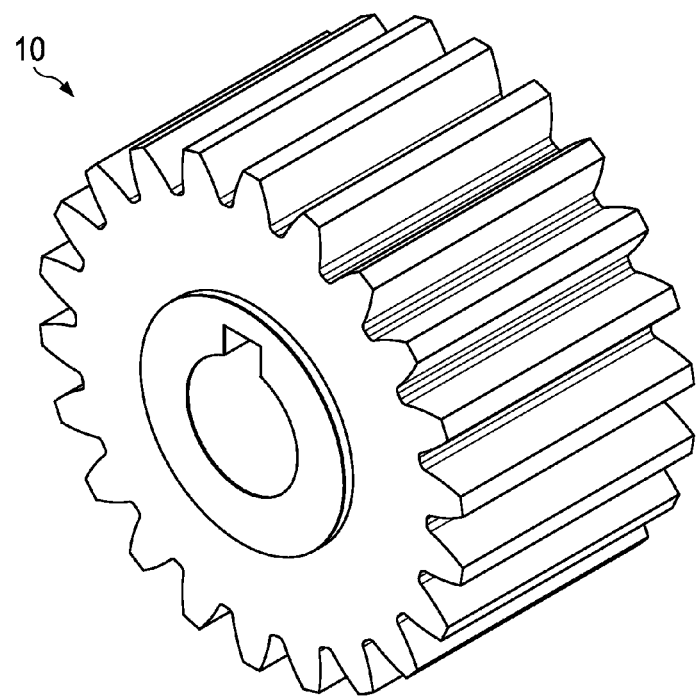
Figure 1B:
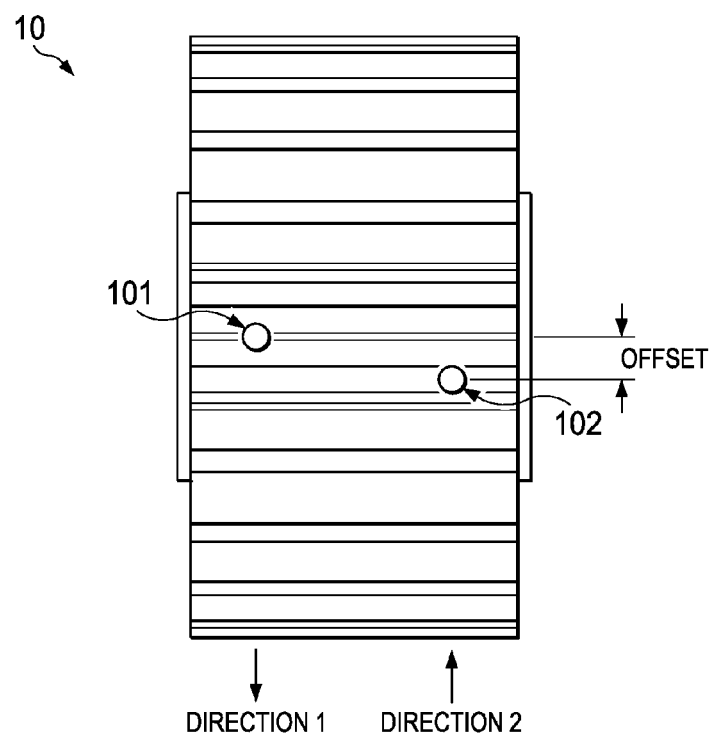

FIGS. 1A, 1B, 1C illustrate an example functional embodiment of inductive gear sensing for a spur gear 10 constructed of conductive material (such as a ferrous metal). Spur gear 10 is an example of a gear with gear teeth parallel to the gear rotational shaft (i.e., the gear teeth are disposed orthogonal to a direction of movement relative to the sensor).

Differential sensors 101 and 102 are disposed adjacent the gear, offset relative to the gear shaft rotation. As a result, respective differential sensor responses 111 (sensor 101) and 112 (sensor 102) lead-lag based on gear rotational direction. That is, differential sensors 101 and 102 are offset relative to the gear teeth, such that a gear tooth passes first under one sensor, and then under the second, offset sensor (depending on gear direction).

Inductive sensing is based on the axial proximity of conductive gear material relative to a sensor. The sensor defines a sensing area commensurate in size to the size of a gear tooth such that movement of the gear tooth past the sensor results in an axially-sensed pulsed sensor response.

The differential sensor responses 111/112 can be converted to sensor response data representative of gear movement, such as rotational direction, speed and angular position. Each time a gear tooth passes, a sensor response pulse is recorded first by one sensor, and next by the offset sensor (for example, for Direction 1, 101 and then 102). Rotational direction can be determined by measuring a phase difference in the pulse response from both sensors (i.e., the sign of the phase difference), and gear speed and angular position can be determined by measuring the rate of the pulses recorded by at least one of the offset sensors.

Figure 2A:
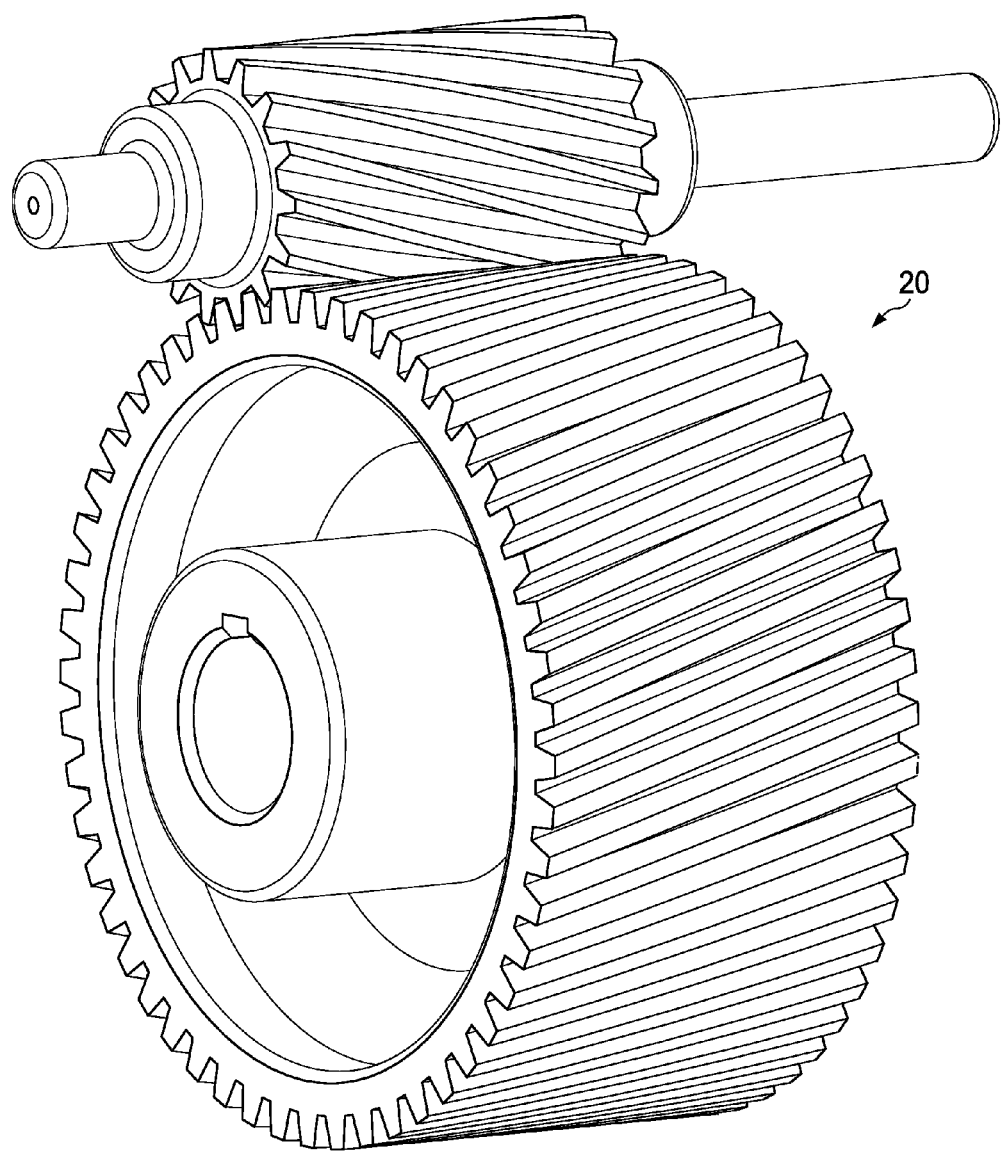
Figure 2B:
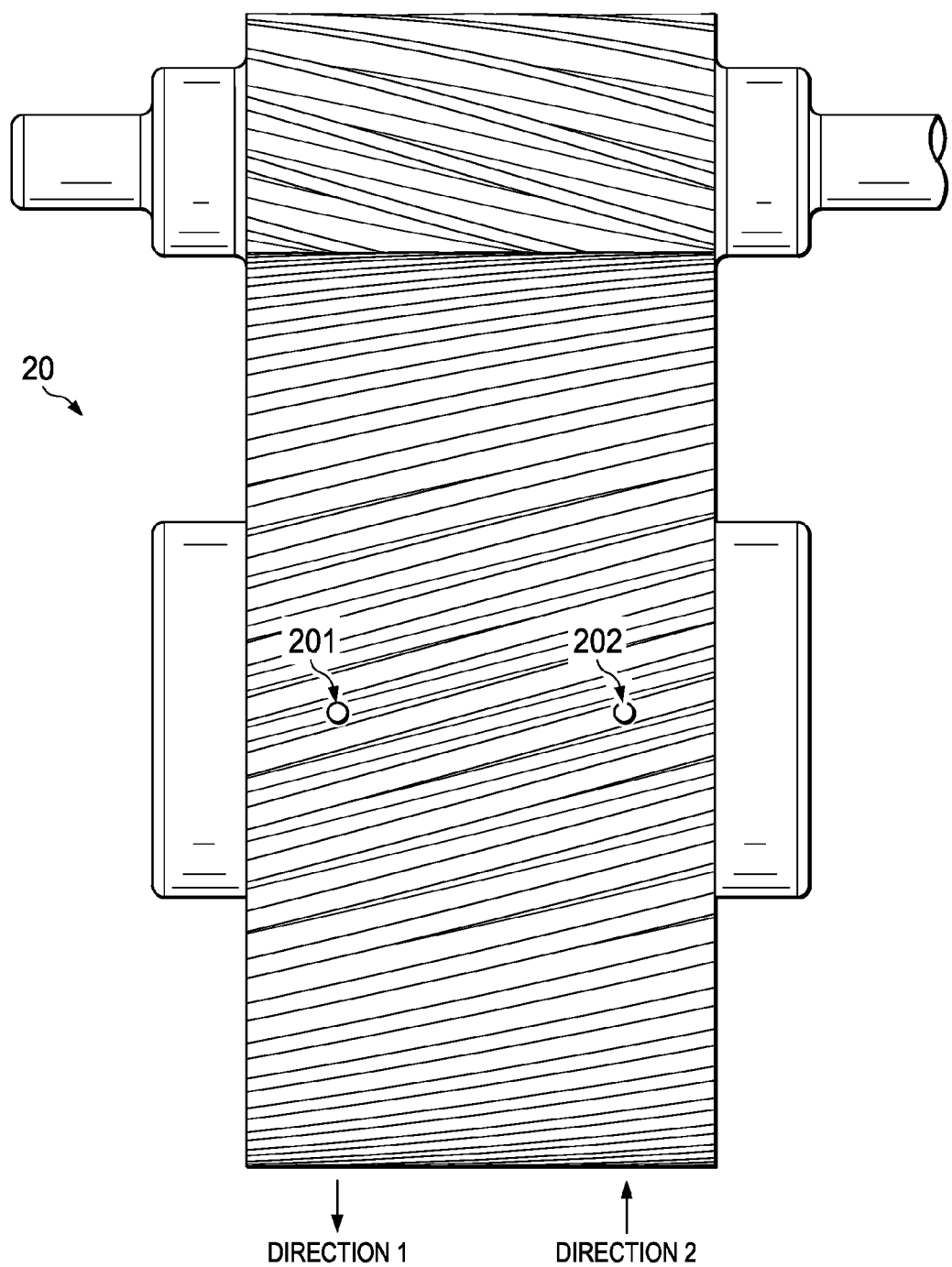

FIGS. 2A, 2B, 2C illustrate an example functional embodiment of inductive sensing for a helical gear 20 constructed of conductive material (such as a ferrous metal). Helical gear 20 is an example of a gear with gear teeth non-parallel to the gear rotational shaft (i.e., the gear teeth are disposed at an angle to a direction of movement relative to the sensor).

Differential sensors 201 and 202 are aligned with the gear shaft, such that respective differential sensor responses 211 (sensor 201) and 212 (sensor 102) lead-lag based on rotational direction. That is, differential sensors 201 and 202 are in-line relative to gear rotation (aligned with the gear shaft), such that a helical gear tooth passes first under one sensor, and then under the second, offset sensor (depending on gear direction).

Inductive sensing is based on the axial proximity of conductive gear material relative to a sensor. The sensor defines a sensing area commensurate in size to the size of a gear tooth such that movement of the gear tooth past the sensor results in an axially-sensed pulsed sensor response.

The differential sensor responses 211/212 can be converted to sensor response data representative of gear movement, such as rotational direction, speed and angular position. Each time a helical gear tooth passes, a sensor response pulse is recorded first by the sensor the gear tooth passes under first, and next by the (in-line) sensor the gear tooth passes under next. Due to the helical arrangement of the gear teeth, a phase difference is observed in the response from both sensors. Rotational direction can be determined by measuring a phase difference in the response from both sensors (i.e., the sign of the phase difference), and gear speed and angular position can be determined by measuring the rate of the pulses recorded by at least one of the offset sensors.

Figure 3A:
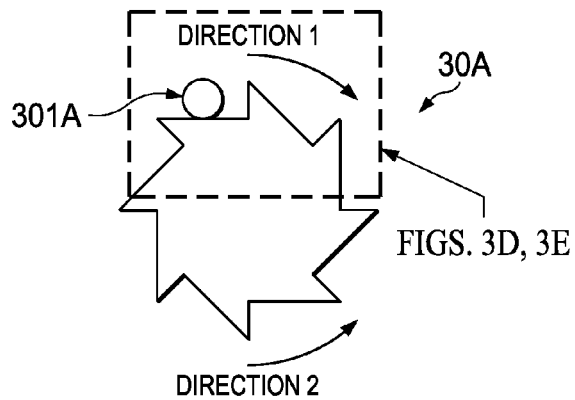
FIGS. 3A, 3B, 3C illustrate example functional embodiments of inductive gear sensing, including gear direction, for a gear with asymmetrically shaped gear teeth, and with a single sensor that provides an asymmetrical response such that gear direction can be derived from the difference between rise and fall time, including: (3A) a relatively flatter gear (30A) with a side mounted sensor (301A), and (3B) a relatively thicker gear (30B) with a top mounted sensor (301B), such that (3C) asymmetric sensor response indicates gear direction.
Figure 3B:
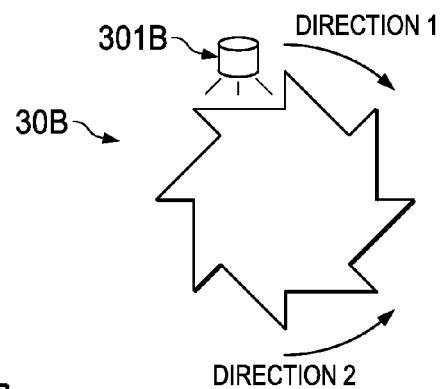
Figure 3D:
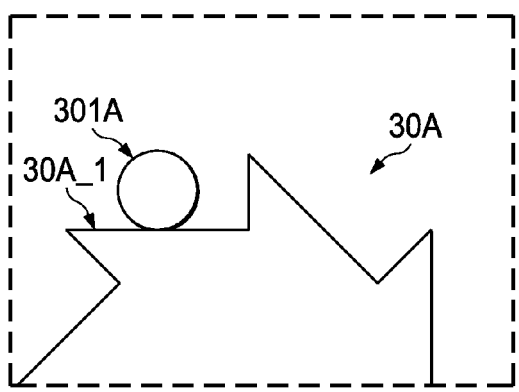
FIGS. 3D and 3E are exploded views of the gear/sensor of FIG. 3A with a side mounted sensor (301A), illustrating rotation of a gear tooth relative to the sensor (sensing area), and lateral inductive sensing.
Figure 3E:
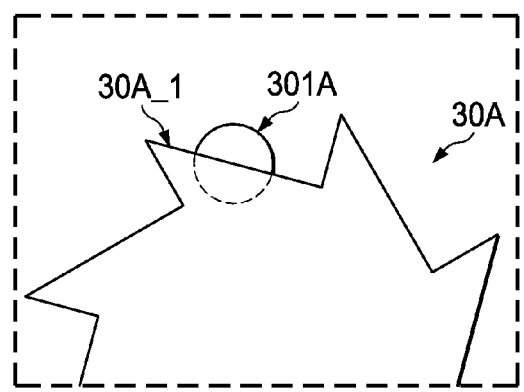
Figure 3C:
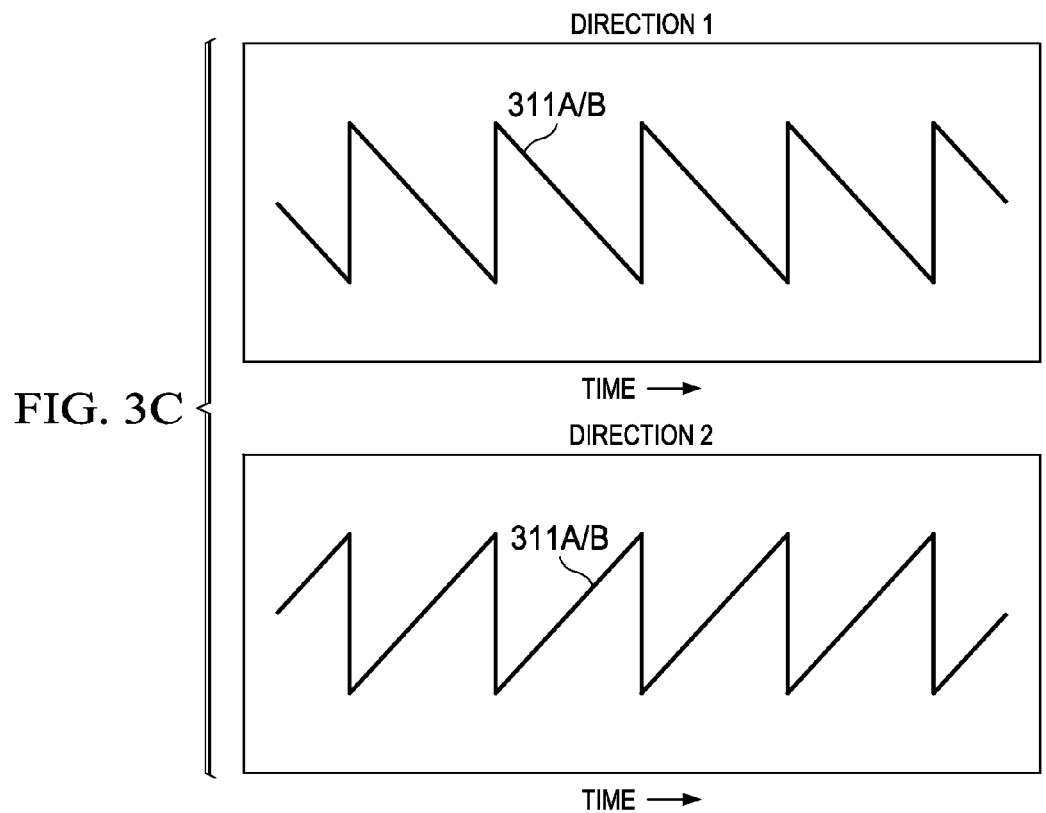
Figure 4C:
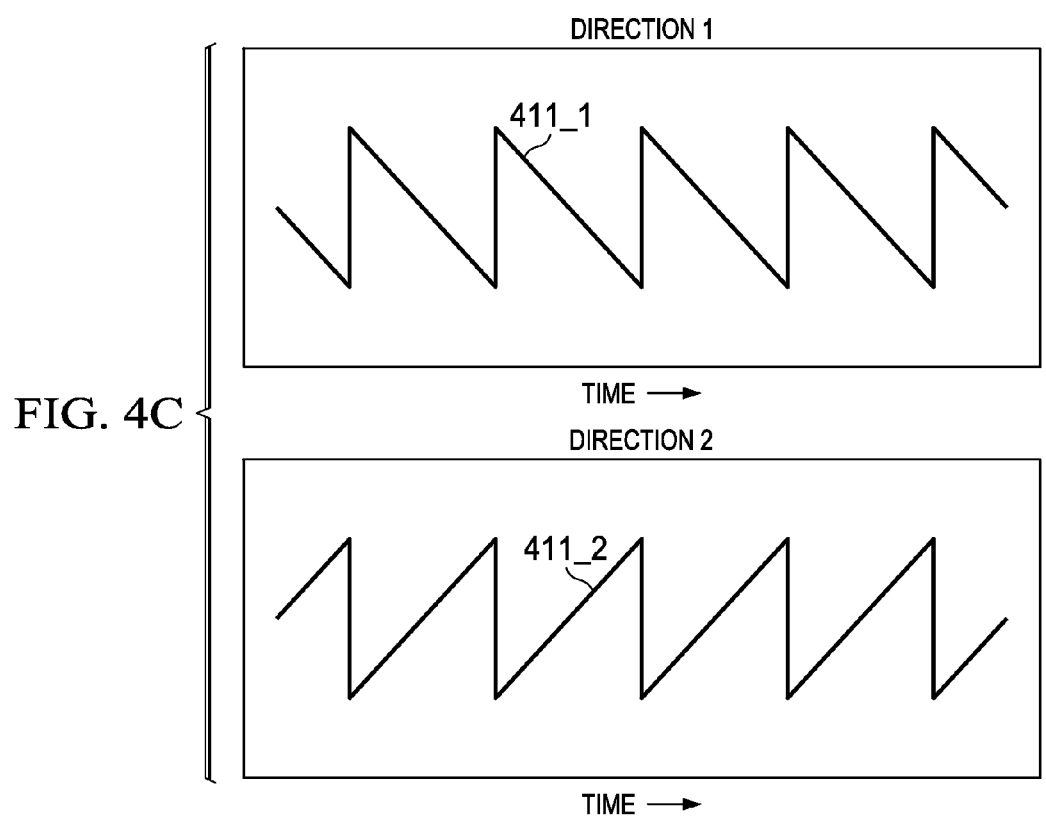
FIGS. 4A, 4B, 4C illustrates an example functional embodiment of inductive gear sensing, including gear direction, including: (4A) a spur gear target (40), using (4B) a single asymmetrically shaped/profiled inductor (401) with an incline orientation relative to the gear shaft, providing (4C) an asymmetric response based on asymmetrical sensitivity from one end of the sensor to the other, such that gear direction can be derived from the difference between rise and fall time.

FIGS. 3 and 4 illustrate inductive gear sensing based on generating asymmetrical response signals from a single sensor based on lateral sensing with, respectively, asymmetrical gear teeth, or an asymmetrical sensor. Gear direction can be derived from asymmetrical rise and fall times for sensor response (FIGS. 3C and 4C).

FIGS. 3A, 3B, 3C illustrate example functional embodiments of inductive sensing for a gear with asymmetrically shaped gear teeth, constructed of conductive material (such as a ferrous metal). A single sensor disposed adjacent the gear provides an asymmetrical response based on gear direction (and the asymmetrical shape/profile of the gear teeth).

FIG. 3A illustrates an asymmetrical gear 300A that is relatively flatter, so that the sensor can be side mounted. FIG. 3B illustrates an asymmetrical gear 300B that is relatively thicker, so that the sensor can be top mounted.

In both embodiments, the asymmetrical shape/profile of the gear teeth produces an asymmetrical response 311A/B and 312A/B based on the direction of gear rotation. Specifically, gear rotation determines the asymmetrical area of the conductive gear tooth that is within the sensing area of the sensor as the gear tooth rotates through the sensing area.

Inductive sensing is based on the lateral sensing of conductive gear material relative to a sensor. The sensor defines a sensing area commensurate in size to the size of a gear tooth such that movement of the gear tooth past the sensor results in a laterally-sensed, asymmetrical sensor response. That is, for both implementations, as the gear rotates past the sensor, the area of the conductive gear tooth material that is within the sensing area changes, resulting in the asymmetrical sensor responses of FIG. 3C, which difference in rise and fall times are depending on direction of movement.

FIGS. 3D and 3E are exploded views of the gear/sensor of FIG. 3A with a side mounted sensor 301A, illustrating inductive lateral sensing. As gear 30A rotates, gear tooth 30A_1 rotates relative to the sensor so that more of the conductive gear tooth material is within the sensing area of sensor 301A.

The asymmetrical sensor responses 311A/B can be converted to sensor response data representative of gear movement, including rotational direction, speed and angular position. Each time a gear tooth rotates through the sensing area, an asymmetrical sensor response is recorded. Rotational direction can be determined by the asymmetrical response (i.e., the rise and fall times of the sensor response 311A/B), and gear speed and angular position can be determined by measuring the rate of the asymmetrical pulses recorded by the sensor.

Figure 4A:
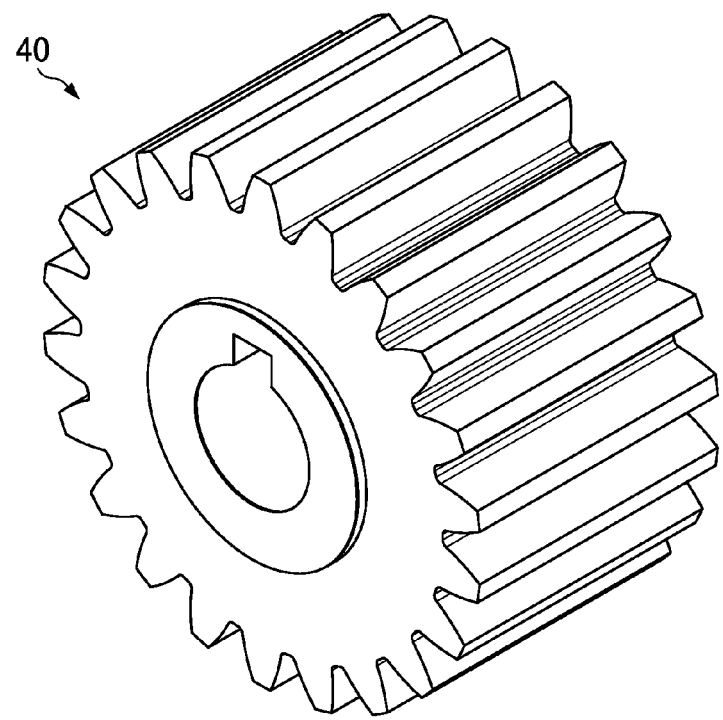
Figure 4B:
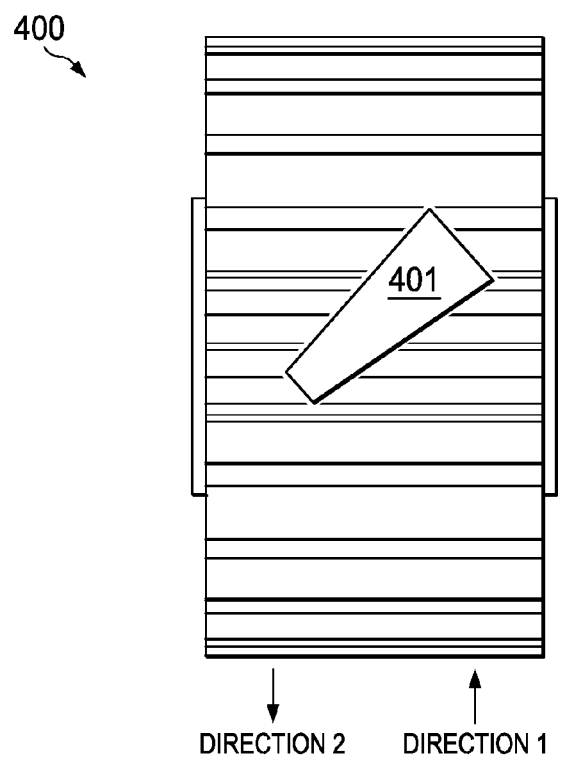

FIGS. 4A, 4B, 4C illustrate an example functional embodiment of inductive sensing for a single asymmetrically shaped/profiled sensor 401, with asymmetrical sensitivity from one end of the sensor to the other. FIGS. 4A/B illustrate a spur gear configuration, although this description applies to an asymmetrical sensor with a helical (or other non-parallel) gear configuration. In either case, the asymmetrical sensor is disposed with an incline orientation relative to the gear teeth, such that sensor response is asymmetric as the gear teeth move past the sensor ends with asymmetrical sensitivity at different times, such that gear direction can be derived from the difference between rise and fall time due to the difference in sensitivity.

For the spur gear configuration, with gear teeth parallel to the rotational gear shaft, the asymmetrically shaped/profiled sensor 401 is asymmetrically positioned relative to the gear shaft (rotational direction). The asymmetrical sensor provides an asymmetrical response 411_1/411_2 based on asymmetrical sensitivity from one end to the other of the asymmetrically configured sensor. The sensor response is asymmetric with respect to gear direction due to the asymmetrical orientation of sensor 401 relative to the gear teeth.

Inductive sensing is based on the lateral sensing. It is not always desirable to use multiple sensors (such as in FIGS. 1A/1B and 2A/2B), or to shape the teeth of a gear (such as in FIGS. 3A/3B). As an alternative, gear/sensor configuration, a shaped, asymmetrical sensor can be given an elongated shape and made such that its sensitivity on either end of the sensor surface that is facing the gear teeth is different. Furthermore, the sensor can be mounted at an angle relative to the gear teeth that pass under the sensor. Depending on the direction of the gear teeth passing under the sensor, a given gear tooth will be sensed first by one end of the sensor, and then by the other. For example, for direction 1 (411_1), a gear tooth will be sensed first by the high sensitivity end, and then by the low sensitivity end. Since the sensitivity of the sensor on each side is different, the direction of the teeth can be derived from the measured sensor response.

The Disclosure provided by this Description and the Figures sets forth example embodiments and applications, including associated operations and methods, that illustrate various aspects and features of the invention. Known circuits, functions and operations are not described in detail to avoid unnecessarily obscuring the principles and features of the invention. These example embodiments and applications can be used by those skilled in the art as a basis for design modifications, substitutions and alternatives to construct other embodiments, including adaptations for other applications. Accordingly, this Description does not limit the scope of the invention, which is defined by the Claims.

The invention claimed is:

1. An inductive sensing system suitable to sensing movement of a conductive gear, comprising:
a conductive gear with gear teeth; and
first and second inductive sensors disposed adjacent the gear, such that gear movement causes the gear teeth to move past the inductive sensors;
each sensor operable to project a sensing area corresponding in size to the gear teeth, such that gear tooth movement past the sensor results in an axially-sensed sensor response pulse;
the sensors arranged such that gear movement causes each gear tooth to move through the sensing area of the first sensor with a time differential relative to such gear tooth moving through the sensing area of the second sensor;
such that the sensors are operable to provide respective differential sensor response pulses with a phase difference corresponding to the direction of movement of the gear teeth relative to the sensors.

2. The system of claim 1:
wherein the gear teeth are orthogonal to the direction of movement, and
wherein the sensors are offset relative to the direction of movement.

3. The system of claim 1:
wherein the gear teeth are at an angle to the direction of movement; and
wherein the sensors are in-line and orthogonal to the direction of movement.

4. The system of claim 1 wherein the gear is a rotational gear such that gear tooth movement is defined by gear rotation.

5. The system of claim 1, wherein each sensor is operable to provide sensor response pulses with a frequency corresponding to the speed of movement of the gear teeth.

6. A gear assembly, comprising:
a conductive gear with gear teeth; and
first and second inductive sensors disposed adjacent the gear, such that gear movement causes the gear teeth to move past the inductive sensors;
each sensor operable to project a sensing area corresponding in size to the gear teeth, such that gear tooth movement past the sensor results in an axially-sensed sensor response pulse;
the sensors arranged such that gear movement causes each gear tooth to move through the sensing area of the first sensor with a time differential relative to such gear tooth moving through the sensing area of the second sensor;
such that the sensors are operable to provide respective differential sensor response pulses with a phase difference corresponding to the direction of movement of the gear teeth relative to the sensors.

7. The gear assembly of claim 6:
wherein the gear teeth are orthogonal to the direction of movement, and
wherein the sensors are offset relative to the direction of movement.

8. The gear assembly of claim 6:
wherein the gear teeth are at an angle to the direction of movement; and
wherein the sensors are in-line and orthogonal to the direction of movement.

9. The gear assembly of claim 6 wherein the gear is a rotational gear such that gear tooth movement is defined by gear rotation.

10. The gear assembly of claim 6, wherein each sensor is operable to provide sensor response pulses with a frequency corresponding to the speed of movement of the gear teeth.

11. A method of sensing gear movement suitable for use with a conductive gear with gear teeth, comprising:
disposing first and second inductive sensors adjacent the gear, such that gear movement causes the gear teeth to move past the inductive sensors;

configuring each sensor to project a sensing area corresponding in size to the gear teeth, such that gear tooth movement past the sensor results in an axially-sensed sensor response pulse;

arranging the sensors such that gear movement causes each gear tooth to move through the sensing area of the first sensor with a time differential relative to such gear tooth moving through the sensing area of the second sensor;

in response to gear movement, generating respective differential sensor response pulses with a phase difference corresponding to the direction of movement of the gear teeth relative to the sensors.

12. The method of claim 11 wherein the gear is constructed with gear teeth that are orthogonal to the direction of movement, and wherein:

the first and second sensors are disposed offset relative to the direction of movement.

13. The method of claim 11 wherein the gear is constructed with gear teeth that are at an angle to the direction of movement, and wherein:

the first and second sensors are disposed in-line and orthogonal to the direction of movement.

14. The method of claim 11 wherein the gear is a rotational gear such that gear tooth movement is defined by gear rotation.

15. The method of claim 11, further comprising:

in response to gear movement, generating sensor response pulses with a frequency corresponding to the speed of movement of the gear teeth.

\* \* \* \* \*